(12) United States Patent  
Miks et al.

(10) Patent No.: US 7,193,305 B1
(45) Date of Patent: Mar. 20, 2007

(54) MEMORY CARD ESC SUBSTRATE INSERT

(75) Inventors: Jeffrey Alan Miks, Chandler, AZ (US); Curtis Michael Zwenger, Chandler, AZ (US); Brenda Concepcion Gogue, Gilbert, AZ (US); Stephen Gregory Shermer, Chandler, AZ (US); Maximilien Jouchin d'Estries, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/980,355

(22) Filed: Nov. 3, 2004

(51) Int. Cl.
*H01L 23/02* (2006.01)

(52) U.S. Cl. .................. 257/679; 257/676; 257/693; 257/697; 257/E23.061; 257/E23.064

(58) Field of Classification Search .............. 257/679
See application file for complete search history.

(56) References Cited

U.S. PATENT DOCUMENTS

| | | |
|---|---|---|
| 3,668,299 A | 6/1972 | McNeal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 8,360,992 | 11/1994 | Lowrey et al. |
| 5,440,451 A * | 8/1995 | Saito et al. .................. 361/760 |
| 5,574,309 A | 11/1996 | Papapietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota et al. |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 6,040,622 A | 3/2000 | Wallace |
| 6,143,981 A | 11/2000 | Glenn |
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,462,273 B1 | 10/2002 | Corisis et al. |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | DiCaprio et al. |
| 2002/0131251 A1* | 9/2002 | Corisis et al. .............. 361/760 |
| 2002/0140068 A1 | 10/2002 | Lee |
| 2004/0090829 A1* | 5/2004 | Miura et al. ................. 365/200 |
| 2004/0169285 A1* | 9/2004 | Verma et al. ................ 257/777 |

FOREIGN PATENT DOCUMENTS

| | | |
|---|---|---|
| JP | 3112688 | 5/1991 |
| JP | 7017175 | 1/1995 |
| JP | 8190615 | 7/1996 |
| JP | 10334205 | 12/1998 |

* cited by examiner

*Primary Examiner*—Tu-Tu Ho
(74) *Attorney, Agent, or Firm*—Stetina Brunda Garred & Brucker

(57) ABSTRACT

A memory card comprising a leadframe having a die pad, and an insert having a plurality of contacts. Attached to the die pad is a semiconductor die which is electrically connected to the contacts of the insert. A body covers the die pad and the semiconductor die and partially covers the insert such that the contacts are exposed in an exterior surface of the body.

19 Claims, 4 Drawing Sheets

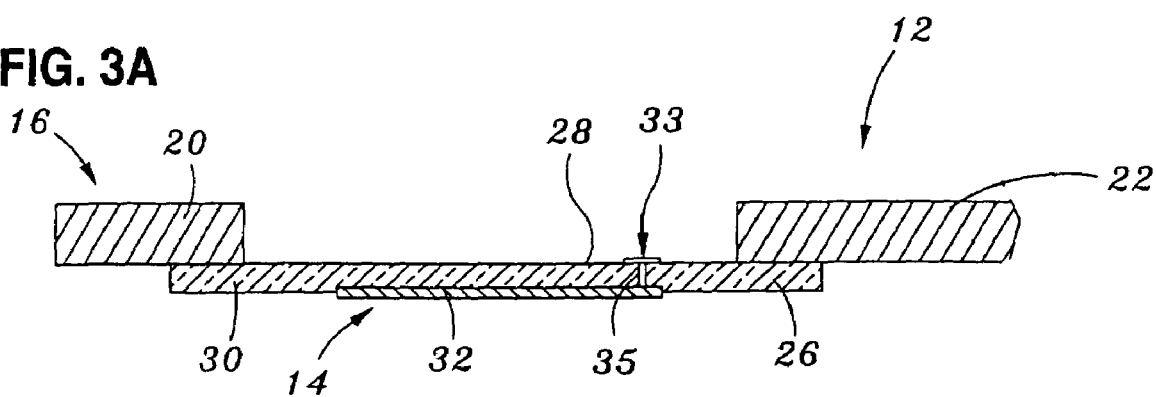
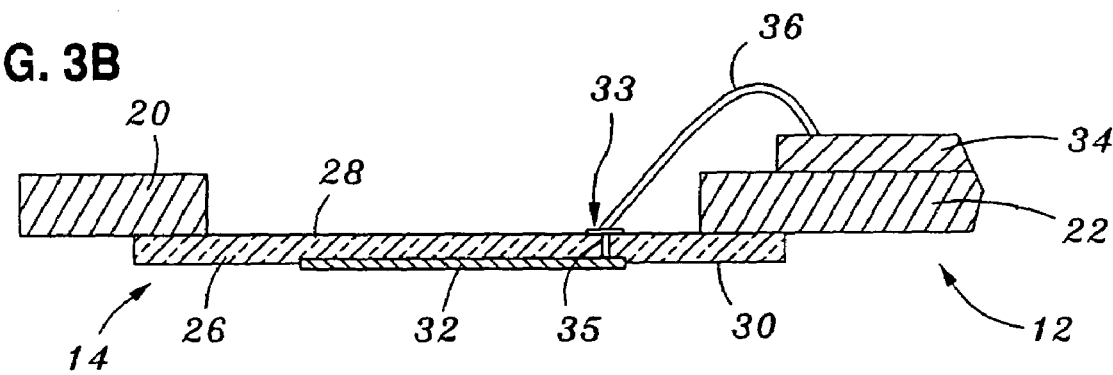
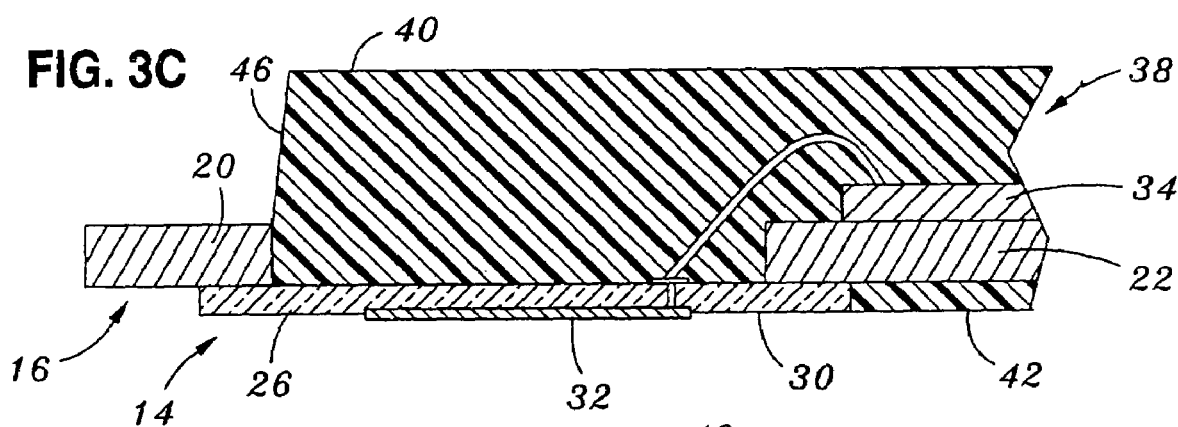
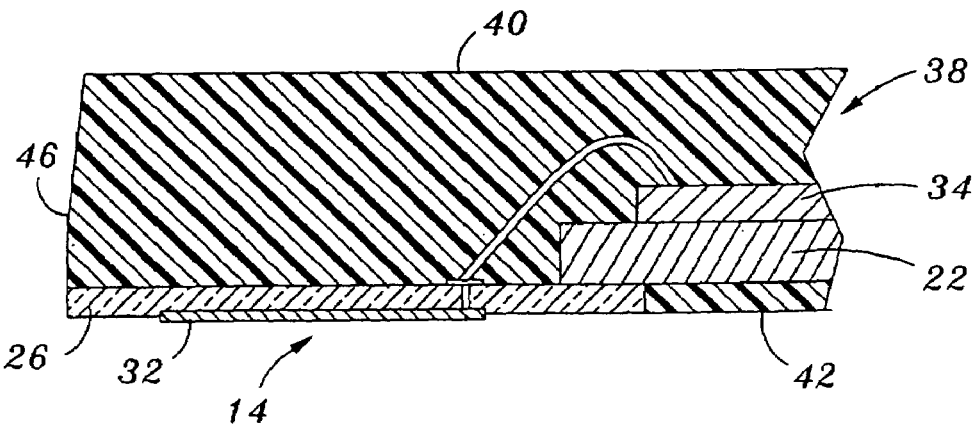

MEMORY CARD ESC SUBSTRATE INSERT

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to memory cards, and more particularly, to a memory card (e.g., a multi-media card (MMC) or secure digital card (SDC)) wherein a standoff insert such as a laminate insert is used to define the external signal contacts (ESC's) of the memory card structure so that the tie bars normally used to connect the contacts to the outer frame of the leadframe in leadframe based memory cards can be eliminated and components of increased height may be integrated into the leadframe or non-leadframe (e.g., laminate substrate) based memory cards.

As is well known in the electronics industry, memory cards are being used in increasing numbers to provide memory storage and other electronic functions for devices such as digital cameras, MP3 players, cellular phones, and Personal Digital Assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the backside of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with the die pad of the leadframe and the semiconductor die mounted thereto being disposed within or covered by the body.

Memory cards, such as multi-media cards and secure digital cards, are used by advancing the same into a host socket which includes a plurality of connector pins. Many host sockets include a number of connector pins sufficient to accommodate the contacts included in memory card formats such as multi-media cards and secure digital cards. Applicant has previously determined that one of the drawbacks associated with leadframe based memory cards is that portions of the tie bars which are used to connect the contacts to the outer frame of the leadframe are typically exposed in the leading edge of the memory card which is initially advanced into the host socket. More particularly, exposed within this leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential to short against the metal features of the host socket, and are thus highly undesirable.

With particular regard to secure digital cards, a drawback associated with both the conventional and leadframe based configurations of such cards is the inherent limitations regarding the maximum height of the electronic components which may be integrated thereinto. In this regard, in secure digital cards as currently known and manufactured, a 1.2 mm tall package is generally regarded as the largest package that could be integrated into the card. Despite the need in the electronics industry for a 1.4 mm tall package flash option in secure digital cards, a 1.4 mm tall package is generally regarded as being too tall for such cards.

The present invention addresses and overcomes all of the aforementioned problems in currently known memory cards by providing a standoff insert which is used to define the external signal contacts of a leadframe based memory card so that the tie bars normally used to connect the contacts to the outer frame of the leadframe can be eliminated. With regard to both leadframe based memory cards and conventional laminate substrate based memory cards, the insert of the present invention allows components of increased height (e.g., a 1.4 mm tall package) to be integrated into the card. It is contemplated that as memory cards and other products consistent with the present invention are developed, other dimensional limitations may apply. These and other attributes of the present invention will be described in more detail below.

BRIEF SUMMARY OF THE INVENTION

In accordance with the present invention, there is provided a memory card which includes an external signal contact (ESC) standoff insert. The insert of the present invention may be fabricated as a laminate substrate, including the external signal contacts disposed on one side or surface thereof. In one embodiment of the present invention, the insert is used in conjunction with a leadframe which has a semiconductor die mounted to a die pad thereof, the semiconductor die being electrically connected to the insert. In another embodiment of the present invention, the insert is electrically connected to a laminate substrate which itself has various electronic components, including a TSOP device, electrically connected thereto. In each embodiment of the present invention, the semiconductor die or electronic components are covered by a body of the memory card, that side or surface of the insert having the contacts disposed thereon being exposed in the body.

In leadframe based memory cards, the insert of the present invention effectively eliminates exposed metal features in the leading edge of the memory card. For both leadframe based memory cards and conventional laminate substrate based memory cards, the insert of the present invention allows components of increased height (e.g., TSOP's) to be integrated into such cards.

The present invention is best understood by reference to the following detailed description when read in conjunction with the accompanying drawings

BRIEF DESCRIPTION OF THE DRAWINGS

These, as well as other features of the present invention, will become more apparent upon reference to the drawings wherein:

FIGS. 3A–3D illustrate an exemplary sequence of steps which may be used to facilitate the interface of the standoff insert to the leadframe shown in FIG. 2 in accordance with a first embodiment of the present invention;

Common reference numerals are used throughout the drawings and detailed description to indicate like elements.

DETAILED DESCRIPTION OF THE INVENTION

Figure 1:
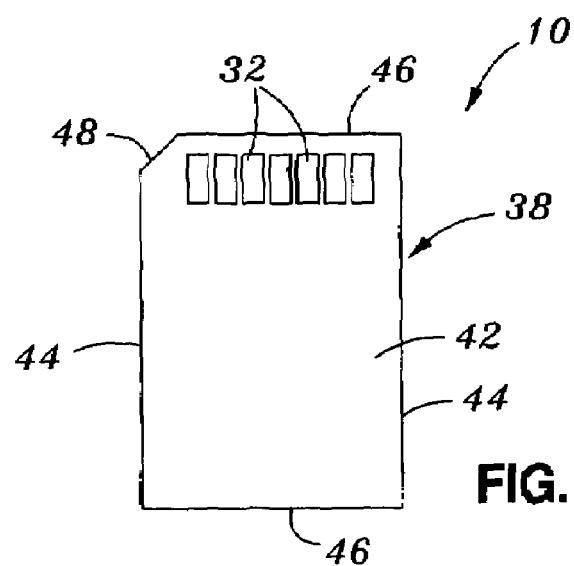
FIG. 1 is a bottom plan view of a leadframe based memory card fabricated through the use of an external signal contact standoff insert in accordance with the present invention.
Figure 2:
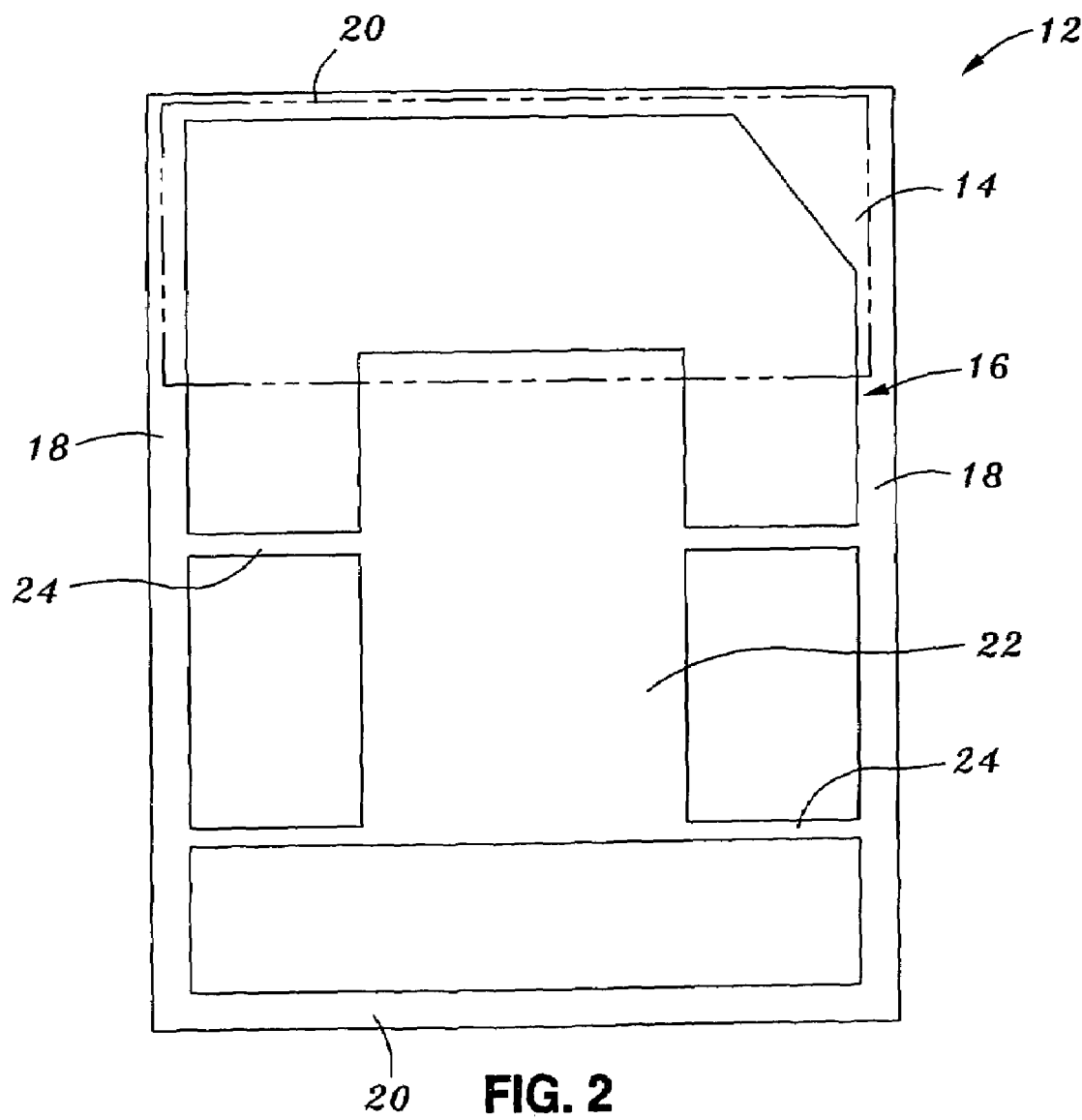
FIG. 2 is a top plan view of the leadframe of the memory card shown in FIG. 1 prior to the interface of the standoff insert thereto.

Referring now to the drawings wherein the showings are for purposes of illustrating preferred embodiments of the present invention only, and not for purposes of limiting the same, FIG. 1 depicts a memory card 10 which is fabricated through the use of the leadframe 12 shown in FIG. 2 and the external signal contact substrate insert 14 shown in FIGS. 3A–3D. As shown in FIG. 1, the memory card 10 has a form factor particularly suited for use in a multi-media card memory application. However, those of ordinary skill in the art will recognize that the memory card 10 may have alternative memory card formats, including those of secure digital cards (SDC), compact flash (CF), smart media, memory stick, and other small form factor memory cards. An embodiment of the present invention wherein the insert 14 is integrated into a memory card having a secure digital card format will be discussed below.

The leadframe 12 of the memory card 10 comprises an outer frame or dambar 16 which is eventually removed from the leadframe 12 as will be described below, and thus does not constitute a part of the completed memory card 10. The dambar 16 has a generally rectangular configuration defining an opposed pair of longitudinal sides or segments 18 and an opposed pair of lateral sides or segments 20. In addition to the dambar 16, the leadframe 12 includes a die attach area or die pad 22 which is disposed within the interior of the dambar 16. Die pad 22 defines opposed, generally planar top and bottom surfaces. Tie bars 24 are used to integrally connect the die pad 22 to the longitudinal sides 18 of the dambar 16. Absent from the leadframe 12 are the external signal contacts which normally constitute a portion thereof in current leadframe based memory card designs.

Referring now to FIGS. 3A–3D, in accordance with a first embodiment of the present invention, the memory card 10 is fabricated by initially attaching the insert 14 to the underside or bottom surface of the leadframe 12 in the manner shown in FIG. 3A. The insert 14 itself comprises a substrate 26 (e.g., a laminate substrate) defining a generally planar top surface 28 and an opposed, generally planar bottom surface 30. It is contemplated that in its original, unsingulated state, the substrate 26 may have a quadrangular (e.g., rectangular) configuration, though the present invention is not limited to any particular shape for the substrate 26. Formed on the bottom surface 30 of the substrate 26 are a plurality of external signal pads or contacts 32. The number of contacts 32 formed on the bottom surface 30 is dependent on the particular format or application for the memory card 10. In this regard, the seven (7) contacts 32 shown in FIG. 1 is exemplary only. Disposed on the top surface 28 of the substrate 26 is a conductive pattern 33 comprising conductive pads and/or traces which are each electrically connected to one or more of the contacts 32 through the use of conductive vias 35 which extend through the substrate 26. As shown in FIG. 3A, a peripheral portion of the top surface 28 of the substrate 26 is attached to the bottom surface of the leadframe 12. More particularly, it is contemplated that the peripheral portion of the top surface 28 of the substrate 26 will be attached to a portion of the bottom surface of the die pad 22, portions of the bottom surfaces of each of the longitudinal sides 18 of the dambar 16, and to a portion of the bottom surface of one of the lateral sides 20 of the dambar 16. This contemplated attachment scheme is depicted in FIG. 2 by the showing of the insert 14 in phantom therein. In accordance with the present invention, it is contemplated that the affixation of the insert 14 to the underside of the leadframe 12 in the aforementioned orientation will be facilitated through the use of glue or a pressure sensitive tape.

Subsequent to the attachment of the insert 14 to the leadframe 12 in the above-described manner, at least one electronic component such as a semiconductor die 34 is attached to the top surface of the die pad 22, as shown in FIG. 3B. As further shown in FIG. 3B, the semiconductor die 34 is itself electrically connected to the insert 14 through the use of at least one conductive wire 36. As will be recognized, one end of the wire 36 is electrically connected to a corresponding pad or terminal on the top surface of the semiconductor die 34, with the opposite end of the same wire 36 being electrically connected to one of the above-described pads or traces of the conductive pattern 33 disposed on the top surface 28 of the substrate 26. Thus, the semiconductor die 34 is effectively placed into electrical communication with at least one of the contacts 32 through the use of the wire(s) 36 and the conductive pattern 33 and vias 35 of the insert 14.

The leadframe 12 is preferably fabricated from a conductive metal material (e.g., copper) through either a chemical etching or mechanical stamping process. Additionally, though only one semiconductor die 34 is shown in FIGS. 3B–3D, those of ordinary skill in the art will recognize that memory card 10 may be configured to include two or more semiconductor dies alone or in combination with one or more other devices. The semiconductor die(s) alone or in combination with one or more other devices and be attached either directly to the die pad 22 as shown and described, or to one or more intervening substrates, such substrate(s) in turn being electrically connected to the insert 14 through the use of conductive wires. Further, the leadframe 12 may be configured to include more than one die pad 22. Still further, it is contemplated that one or more passive devices may optionally be attached directly to the top surface 28 of the substrate 26. Such passive device(s) would be placed into electrical connection to at least one of the contacts 28 through the pads/traces and conductive vias of the insert 14. Thus, the configuration of the leadframe 12 and the arrangement of electronic components thereon is variable, and may be varied as needed to satisfy the requirements of a particular application.

After the semiconductor die(s) 34 has/have been attached to the die pad 22 and electrically connected to the insert 14 in the above-described manner, an encapsulant material is applied to the leadframe 12, the semiconductor die(s) 34, the conductive wire(s) 36, and the insert 14 in the manner shown in FIG. 3C. The encapsulant material is preferably a plastic (e.g., thermoset, thermoplastic) which, upon hardening, forms a body 38 of the memory card 10. The body 38 is formed to provide a prescribed form factor for the memory card 10. The body 38 defines a generally planar top surface 40 and an opposed, generally planar bottom surface 42. In addition, as seen in FIG. 1, the body 38 defines an opposed pair of longitudinal sides 44, an opposed pair of lateral sides 46, and a fifth sloped side 48 which extends angularly between one of the lateral sides 46 and one of the longitudinal sides 44. In the completed body 38, the bottom surface 30 of the substrate 26 is substantially flush with the bottom surface 42 of the body 38. The lateral side 46 of the body 38 disposed closest to the insert 14 and thus partially defining the leading edge of the memory card 10 extends to but does not overlap the corresponding lateral side 20 of the dambar 16 of the leadframe 12.

As seen in FIG. 3D, in the final step of the fabrication process for the memory card 10 in accordance with the first embodiment, subsequent to the formation of the body 38, the leadframe 12 is subjected to a singulation process wherein the dambar 16 is removed therefrom. Such removal typically entails cutting portions of the tie bars 24 which protrude from the body 38. As is apparent from FIGS. 3D and 2, the removal of the dambar 16 also results in removal of portions of the insert 14 from the completed memory card 10. More particularly, those portions of the substrate 26 of the insert 14 which are attached to the dambar 16 of the leadframe 12 are removed as a result of the singulation process. It is contemplated that such singulation process may be completed through a sawing or punching operation. As a result of such singulation, the leading edge of the memory card 10 which is normally advanced into a host socket is defined by the lateral side 46 of the body 38 disposed closest to the contacts 32 and by the severed end of the insert 14 which extends along such lateral side 46 as shown in FIG. 3D. As a result, the leading edge of the memory card 10 is devoid of any exposed leadframe metal features which eliminate potential occurrences of shorting against the metal features of the host socket.

Referring now to FIGS. 4A–4D, there is depicted a sequence of steps which may be used to facilitate the fabrication of the memory card 10 in accordance with a second embodiment of the present invention. In the second embodiment, the leadframe 12 of the memory card 10 is slightly modified in a manner wherein the die pad 22 and the dambar 16 extend along respective ones of a spaced, generally parallel pair of planes. Such offset of the die pad 22 as is shown in FIGS. 4A–4D may be facilitated by forming appropriately configured bends in each of the tie bars 24 extending between the die pad 22 and the longitudinal sides 18 of the dambar 16.

Figure 4A:
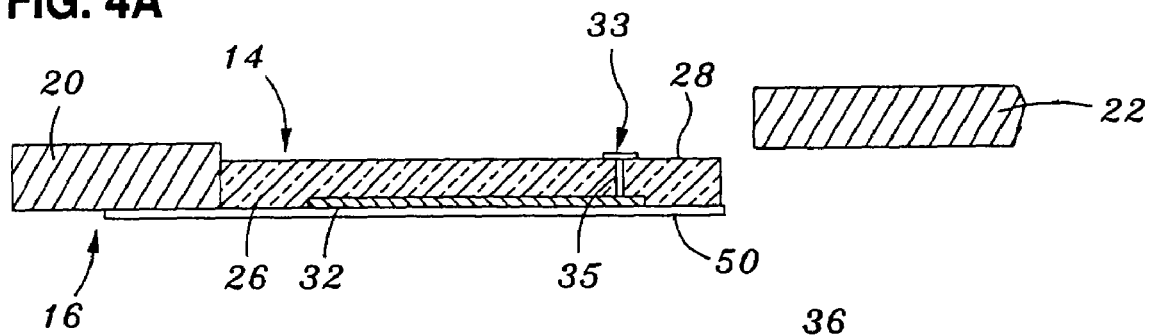
FIGS. 4A–4D illustrate an exemplary sequence of steps which may be used to facilitate the interface of the standoff insert to a leadframe in accordance with a second embodiment of the present invention.
Figure 4B:
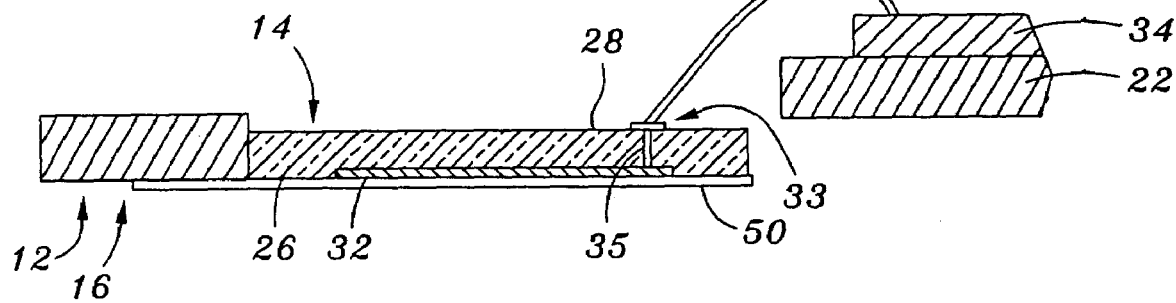

As shown in FIG. 4B, in the second embodiment, the interface of the insert 14 to the leadframe 12 is facilitated by the use of a layer or strip of tape 50, in contrast to the direct attachment of the insert 14 to the leadframe 12 as described in relation to the first embodiment shown in FIGS. 3A–3D. As shown in FIGS. 4A and 4B, the tape 50 is adhered to portions of the underside or bottom surface of the leadframe 12, and more particularly to portions of the bottom surfaces of the longitudinal sides 18 and to a portion of the bottom surface of one of the lateral sides 20 of the dambar 16. Since the die paddle 22 in the leadframe 12 used in the fabrication methodology of the second embodiment is vertically offset relative to the dambar 16 as described above, the tape 50 is not adhered to the bottom surface of the die pad 22. The bottom surface 30 of the substrate 26 of the insert 14 is itself adhered to the tape 50 in the manner shown in FIGS. 4A and 4B. Thus, the tape 50 covers the bottom surface of the insert 14, including the bottom surface 30 of the substrate 26 and contacts 32 disposed thereon. The insert 14 is contained within the interior of the dambar 16, one side or edge of the insert 14 extending along and optionally in direct contact with the adjacent lateral side 20 of the dambar 16. When the insert 14 is adhered to the tape 50 in the above-described manner, the bottom surface 30 of the substrate 26 preferably extends in generally co-planar relation to the bottom surface of the dambar 16 of the leadframe 12.

Subsequent to the attachment of the insert 14 to the leadframe 12 through the use of the tape 50 in the above-described manner, the semiconductor die 34 is attached to the top surface of the die pad 22 and electrically connected to the insert 14 through the use of the conductive wire 36, as shown in FIG. 4B. The structural attributes of the insert 14 and various options and alternatives that may be employed in the number and arrangement of electronic components interfaced to the die pad 22 and/or directly to the insert 14 is the same as described above in relation to the fabrication methodology of the first embodiment.

Figure 4C:
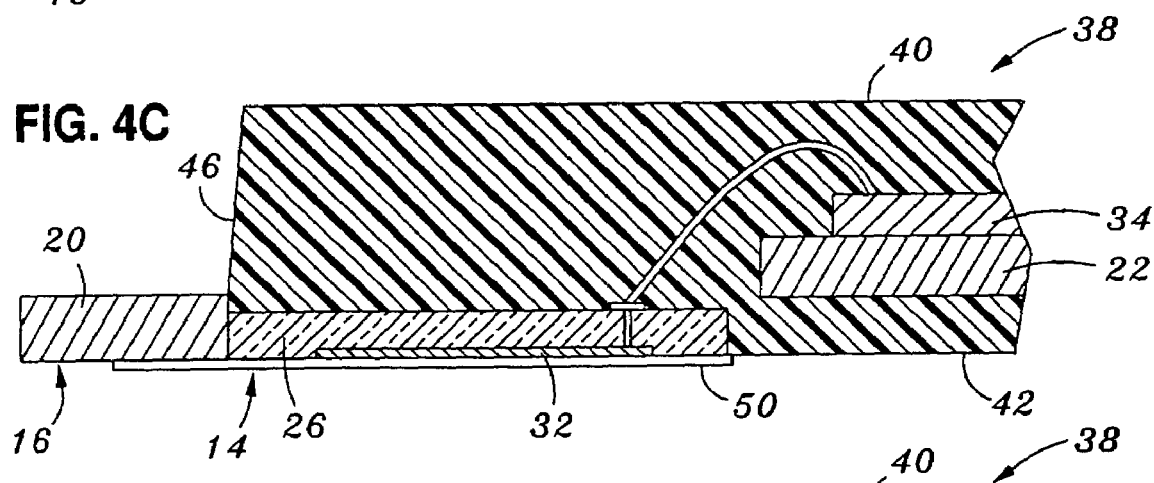

As shown in FIG. 4C, after the semiconductor die(s) 34 has/have been attached to the die pad 22 and electrically connected to the insert 14 in the above-described manner, encapsulant material is applied to the leadframe 12, the semiconductor die(s) 34, the conductive wire(s) 36, and the insert 14 form the body 38. In the completed body 38, the bottom surface 30 of the substrate 26 is substantially flush with the bottom surface 42 of the body 38. The lateral side 46 of the body 38 disposed closest to the insert 14 and thus partially defining the leading edge of the memory card 10 extends to but does not overlap the corresponding lateral side 20 of the dambar 16 of the leadframe 12.

Figure 4D:
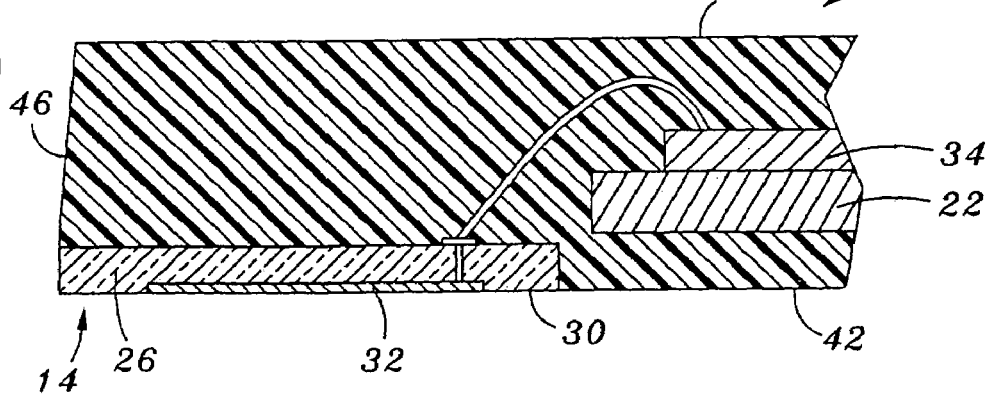

In the final step of the fabrication process for the memory card 10 in accordance with the second embodiment, subsequent to the formation of the body 38, the leadframe 12 is subjected to a singulation process wherein the dambar 16 is removed therefrom as is shown in FIG. 4D. In contrast to the fabrication process described in relation to the first embodiment, the removal of the dambar 16 in the second embodiment does not result in removal of portions of the insert 14 from the completed memory card 10, since the entirety of the insert 14 is contained within the interior of the dambar 16. Upon the singulation of the dambar 16 from the leadframe 12, the leading edge of the memory card 10 which is normally advanced into a host socket is defined by the lateral side 46 of the body 38 disposed closest to the contacts 32 and by the side or edge of the insert which extends along such lateral side 46, as shown in FIG. 4D. The insert 14 may be sized such that opposed sides thereof also extend to and are substantially flush with respective ones of the longitudinal sides 44 of the body 38. Either prior or subsequent to the singulation of the dambar 16 from the leadframe 12, the tape 50 is removed from the insert 14.

Since, in the fabrication processes of the first and second embodiments, at least one and as many as three sides or edges of the insert 14 are covered or encapsulated by the package body 38, it is contemplated that one or more of such encapsulated sides may be provided with a locking feature which facilitates a firm, mechanical interlock with the body 38 when covered or encapsulated by the encapsulation material. Any such locking feature may have any one of a variety of different shapes or configurations.

Figure 5:
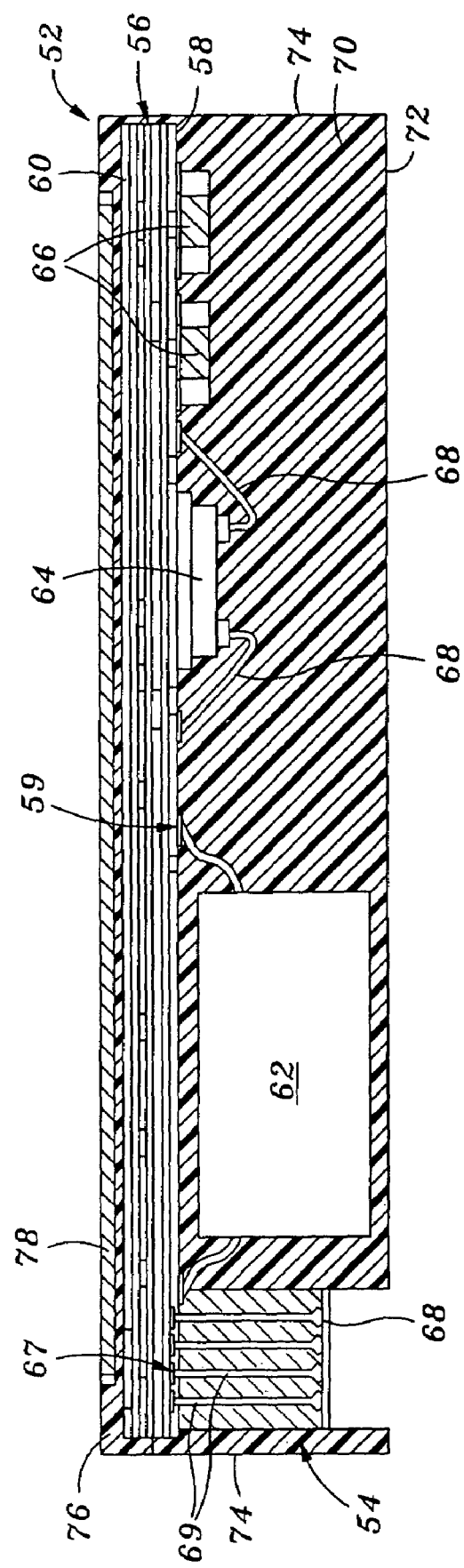
FIG. 5 is a cross-sectional view illustrating a non-leadframe, substrate based memory card including an external signal contact standoff insert constructed in accordance with the present invention integrated thereinto.

The memory card 10 shown in FIG. 1 as fabricated in accordance with the processes of the first and second embodiments as described above is a leadframe based memory card due to the inclusion of the leadframe 12 therein. Referring now to FIG. 5, there is shown a non-leadframe based memory card 52 which is itself fabricated to include an external signal contact substrate insert 54 in accordance with the present invention. It is contemplated that the memory card 52 will have the form factor of a secure digital card. The memory card 52 comprises a substrate 56. The substrate 56 is typically a laminate, and defines opposed, generally planar top and bottom surfaces 58, 60. Disposed on the top surface 58 of the substrate 56 are a plurality of conductive pads and/or traces which are arranged in prescribed patterns and electrically connected to each other in a prescribed manner, hence forming a conductive pattern 59. Attached to the top surface 58 of the substrate 56 and electrically connected to the pads and/or traces of the conductive pattern 59 thereof are a plurality of electronic components, including a TSOP 62, a semiconductor die 64, and passive devices 66. The electrical connection of TSOP 62 to the substrate 56 is facilitated by the electrical connection of the leads protruding from the TSOP 62 to respective ones of the pads and/or traces of the conductive pattern 59. The semiconductor die 64 is itself electrically connected to the pads and/or traces of the conductive pattern 59 through the use of conductive wires 68. The passive devices 66 are themselves placed into direct electrical communication with the pads and/or traces of the conductive pattern 59. Those of ordinary skill in the art will recognize that the number and arrangement of the above-described electronic components on the top surface 58 of the substrate 56 is exemplary only, and may be provided in any one of many variations. One important attribute of the present invention in the context of the memory card 52 shown in FIG. 5 is the ability to include as one of such electronic component the TSOP 62, which represents a substantial improvement over existing secure digital cards wherein the available headroom typically allows for the use of only a WSOP therein as described above.

In addition to the above-described electronic components, also electrically connected to the conductive pattern 59 on the top surface 58 of the substrate 56 is the standoff insert 54. One side of the insert 54 includes a conductive pattern 67 (e.g., conductive pads and/or traces) which is electronically connected to the conductive pattern 59 of the substrate 56. Disposed on that side of the insert 54 opposite that electrically connected to the substrate 56 are a plurality of external signal contacts 68 which are disposed in spaced relation to each other. The contacts 68 are electrically connected to the conductive pattern 59 of the substrate 56 and hence the electronic components mounted thereto through the use of conductive vias 69 which extend through the insert 54 to the conductive pattern 67 thereof. As indicated above, the conductive pattern 67 is electrically connected to the conductive pattern 59 of the substrate 56.

In fabricating the memory card 52, either prior or subsequent to the electrical connection of the insert 54 to the substrate 56, the electronic components electrically connected to the pads and/or traces of the conductive pattern 59 on the top surface 58 are covered or encapsulated by an encapsulant material (e.g., thermoset, thermoplastic) which, upon hardening, forms a body 70 of the memory card 52. As shown in FIG. 5, the body 70 is also formed to partially cover or encapsulate the insert 54, only that surface of the insert 54 including the contacts 68 disposed thereon not being covered by the body 70 and hence exposed therein. The body 70 defines a generally planar top surface 72, an opposed pair of longitudinal sides, and an opposed pair of lateral sides 74. As further shown in FIG. 5, that side or surface of the insert 54 including the contacts 68 formed thereon is recessed relative to the top surface 72 of the body 70 in accordance with the standard configuration of a secure digital card which, as indicated above, is the contemplated form factor for the memory card 52. In fabricating the memory card 52, the substrate 56 is inverted, with a lid 76 being secured to the bottom surface 60 of the substrate 56. Disposed within the lid 76 is a recess which may be used to accommodate a label 78. Thus, the bottom surface of the completed memory card 52 is defined by the top surface 72 of the body 78, with the top surface of the memory card 52 being defined by the lid 76. As a result of the inversion of the substrate 56, the various electronic components and insert 54 electrically connected thereto face downwardly.

It is contemplated that as an alternative to the inclusion of the lid 76, the memory card 52 may be molded to include a unitary body which, in addition to fully encapsulating the electronic components and partially encapsulating the insert 54, also covers the bottom surface 60 of the substrate 56 and thus mimics the structural attributes of the lid 76. Still further, it is contemplated that the body 70 may be eliminated in its entirety, with the substrate 56 having the electronic components and insert 54 electrically connected thereto being positioned between the lid 76 and a separately formed housing section. In any embodiment, the increased headroom attributable to the inversion of the substrate 56 allows TSOP prepackaged flashed to be used in the memory card 52.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A memory card, comprising:
    metal die pad;
    an insert comprising a substrate having a plurality of contacts and a conductive pattern disposed thereon, the contacts being electrically connected to the conductive pattern by conductive vias which extend through the substrate;
    a semiconductor die attached to the metal die pad and electrically connected to the conductive pattern; and
    a body covering the metal die pad and the semiconductor die and partially covering the insert such that the contacts are exposed in a bottom surface of the body.

2. The memory card of claim 1 wherein the semiconductor die is electrically connected to the conductive pattern of the substrate by conductive wires which are covered by the body.

3. The memory card of claim 1 wherein the substrate has a bottom surface which extends in generally co-planar relation to the bottom surface of the body.

4. The memory card of claim 1 wherein:
the body includes a side surface;
the substrate of the insert includes at least one edge which is exposed in the side surface of the body; and
the edge of the substrate and a portion of the side surface of the body in which the edge of the substrate is exposed collectively define a leading edge of the memory card.

5. The memory card of claim 1 wherein the insert and the die pad extend along respective ones of a spaced, generally parallel pair of planes.

6. The memory card of claim 1 wherein the die pad partially overlaps the insert.

7. A memory card, comprising:
a metal die pad;
an insert having a plurality of contacts, the metal die pad partially overlapping the insert;
a semiconductor die attached to the metal die pad and electrically connected to the contacts of the insert; and
a body covering the metal die pad and the semiconductor die and partially covering the insert such that the contacts are exposed in a bottom surface of the body.

8. The memory card of claim 7 wherein the insert comprises:
a substrate having opposed, generally planar top and bottom surfaces, the contacts being disposed on the bottom surface;
a conductive pattern disposed on the top surface; and
conductive vias extending through the substrate and electrically connecting the contacts to the conductive pattern.

9. The memory card of claim 8 wherein the semiconductor die is electrically connected to the conductive pattern of the insert by conductive wires which are covered by the body.

10. The memory card of claim 8 wherein the bottom surface of the substrate and the bottom surface of the body extend in generally co-planar relation to each other.

11. The memory card of claim 7 wherein:
the body defines a side surface;
the insert includes at least one edge which is exposed in the side surface of the body; and
the edge of the insert and a portion of the side surface of the body in which the edge of the insert is exposed collectively define a leading edge of the memory card.

12. A memory card, comprising:
a laminate substrate;
at least one electronic component connected to the laminate substrate;
an insert having a plurality of contacts and attached to the laminate substrate such that the laminate substrate at least partially overlaps the insert, the electronic component being electrically connected to the contacts; and
a body covering the electronic component and partially covering the insert such that the contacts are exposed in a bottom surface of the body.

13. The memory card of claim 12 wherein:
the insert has a first side including a conductive pattern disposed thereon which is electrically connected to the electronic component, a second side opposite the first side and having the contacts disposed thereon, and conductive vias which electrically connect the contacts to the conductive pattern of the insert.

14. The memory card of claim 13 wherein the body is sized and configured such that the second side of the insert having the contacts disposed thereon extends in generally co-planar relation to the bottom surface of the body.

15. The memory card of claim 13 wherein the electronic component is electrically connected to the conductive pattern of the insert by conductive wires which are covered by the body.

16. The memory card of claim 12 wherein the at least one electronic component comprises a TSOP device.

17. The memory card of claim 4 wherein the substrate of the insert has a generally quadrangular configuration.

18. The memory card of claim 11 wherein the insert has a generally quadrangular configuration.

19. The memory card of claim 12 wherein the insert has a generally quadrangular configuration.

* * * * *